(12) United States Patent
Quek et al.

(10) Patent No.: US 7,964,894 B2
(45) Date of Patent: Jun. 21, 2011

(54) INTEGRATED CIRCUIT SYSTEM EMPLOYING STRESS MEMORIZATION TRANSFER

(75) Inventors: Elgin Kiok Boone Quek, Singapore (SG); Pradeep Ramachandramurthy Yelehanka, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 12/784,156

(22) Filed: May 20, 2010

(65) Prior Publication Data
US 2010/0230765 A1  Sep. 16, 2010

Related U.S. Application Data

(62) Division of application No. 11/689,030, filed on Mar. 21, 2007, now Pat. No. 7,759,207.

(51) Int. Cl.
*H01L 27/092* (2006.01)

(52) U.S. Cl. .... 257/190; 257/369; 257/371; 257/E21.63

(58) Field of Classification Search .......... 257/190, 257/369–371, E21.63
See application file for complete search history.

(56) References Cited

U.S. PATENT DOCUMENTS

| | | | |
|---|---|---|---|
| 7,012,028 B2 | 3/2006 | Bu et al. | |
| 7,172,936 B2 | 2/2007 | Sridhar et al. | |
| 7,217,626 B2 | 5/2007 | Bu et al. | |
| 7,714,358 B2 * | 5/2010 | Liu et al. | 257/190 |
| 2005/0191831 A1 | 9/2005 | Tagawa | |
| 2006/0017138 A1 | 1/2006 | Ting | |
| 2006/0099745 A1 | 5/2006 | Hsu et al. | |
| 2007/0105299 A1 | 5/2007 | Fang et al. | |
| 2008/0135873 A1 * | 6/2008 | Fiorenza et al. | 257/190 |
| 2009/0286365 A1 * | 11/2009 | Teo et al. | 438/197 |

* cited by examiner

*Primary Examiner* — Dung A. Le
(74) *Attorney, Agent, or Firm* — Mikio Ishimaru

(57) ABSTRACT

An integrated circuit system that includes: a substrate including a source/drain region defined by a spacer; a gate over the substrate; a gate dielectric between the gate and the substrate; a recrystallized region within the gate and the source/drain region; and a channel exhibiting the characteristics of stress memorization.

10 Claims, 3 Drawing Sheets

INTEGRATED CIRCUIT SYSTEM EMPLOYING STRESS MEMORIZATION TRANSFER

CROSS-REFERENCE TO RELATED APPLICATION(S)

This application is a Divisional of co-pending U.S. application Ser. No. 11/689,030 filed Mar. 21, 2007.

The present application contains subject matter related to co-pending U.S. patent application Ser. No. 11/164,114, assigned to IBM and Chartered Semiconductor Manufacturing Ltd.

TECHNICAL FIELD

The present invention relates generally to integrated circuits, and more particularly to an integrated circuit system employing stress memorization transfer.

BACKGROUND ART

Integrated circuits find application in many of today's consumer electronics, such as cell phones, video cameras, portable music players, computers, etc. Integrated circuits may include a combination of active devices, passive devices and their interconnections.

A common active device within an integrated circuit is the metal-oxide-semiconductor field-effect transistor (MOSFET). A MOSFET generally includes a semiconductor substrate, having a source, a drain, and a channel located between the source and drain. A gate stack composed of a conductive material (i.e. —a gate) and an oxide layer (i.e. —a gate oxide) is typically located above the channel. During operation, an inversion layer forms a conducting bridge or "channel" between the source and drain when a voltage is applied to the gate. Both p-channel and n-channel MOSFET technologies are available and can be combined on a single substrate in one technology, called complementary-metal-oxide-semiconductor or CMOS.

Generally, the amount of current that flows through the channel of a transistor is directly proportional to the mobility of carriers within the channel region. Thus, the higher the mobility of the carriers in the transistor channel, the more current that can flow through the device and the faster it can operate. One way to increase the mobility of carriers in the channel of a transistor is to manufacture the transistor with a stressed channel. Depending upon the type of stressed channel (e.g. —tensile or compressive), significant carrier mobility enhancement has been reported for both electrons and holes.

A conventional technique employed to affect stress within the channel region of a MOSFET includes depositing a stress-inducing layer. Unfortunately, conventional stress-inducing layer deposition processes employ techniques that displace the stress-inducing layer too far from the channel region, thereby reducing its efficacy for promoting carrier mobility.

Thus, a need still remains for a reliable integrated circuit system and method of fabrication, wherein the channel of the integrated circuit system exhibits improved carrier mobility due to the application of a close proximity stress memorization layer. In view of the ever-increasing commercial competitive pressures, increasing consumer expectations, and diminishing opportunities for meaningful product differentiation in the marketplace, it is increasingly critical that answers be found to these problems. Moreover, the ever-increasing need to save costs, improve efficiencies, and meet such competitive pressures adds even greater urgency to the critical necessity that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit system including: a substrate including a source/drain region defined by a spacer; a gate over the substrate; a gate dielectric between the gate and the substrate; a recrystallized region within the gate and the source/drain region; and a channel exhibiting the characteristics of stress memorization.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
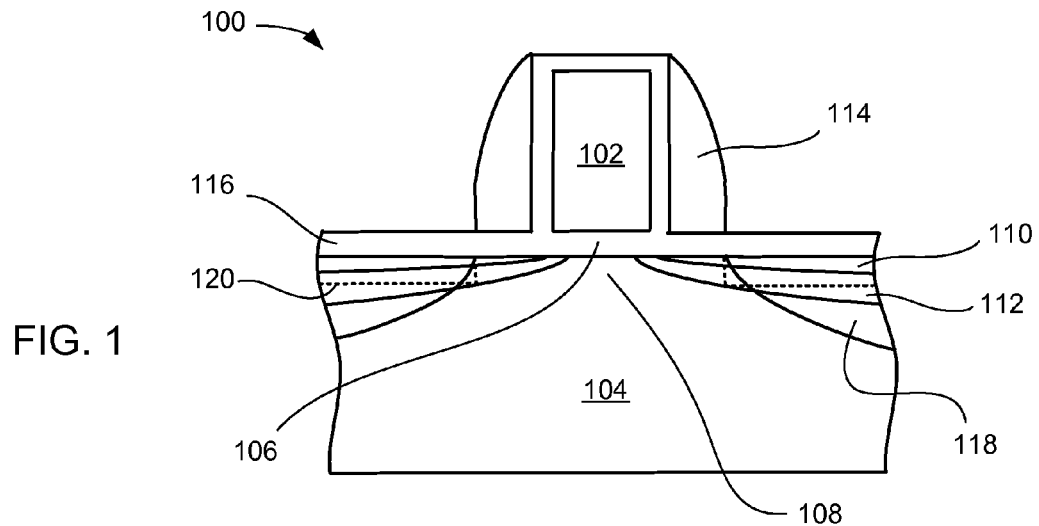
FIG. 1 is a cross-sectional view of an integrated circuit system in an initial stage of manufacture in accordance with an embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown exaggerated in the drawing FIGs. Additionally, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional plane or surface of the substrate, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The term "processing" as used herein includes deposition of material or photoresist, patterning, exposure, development, etching, cleaning, and/or removal of the material or photoresist as required in forming a described structure. The term "exhibiting the characteristics of stress memorization" as used herein includes a structure or element that has its physical properties affected by a close proximity stress memorization layer. The term "close proximity stress memorization layer" is defined to mean a stress memorization layer formed over a gate structure after a gate sidewall spacer has been removed.

Generally, the present invention is directed to the enhancement of transistor carrier mobility by a close proximity stress memorization technique. Typically, stress memorization techniques employ a stress inducing material formed over a transistor with sidewall spacers, which is then annealed to transfer the inherent stress within the stress inducing material to the transistor gate, the transistor source/drain, and the transistor channel. Uniquely, the present invention removes the sidewall spacers formed along the transistor gate, before depositing the stress inducing material, such that the stress inducing material is in closer proximity to the transistor gate and the transistor channel during the stress memorization anneal. By forming the stress inducing material in closer proximity to the transistor gate and the transistor channel, the effectiveness of the stress transfer can be improved and the carrier mobility of the transistor can be improved.

Figure 2:
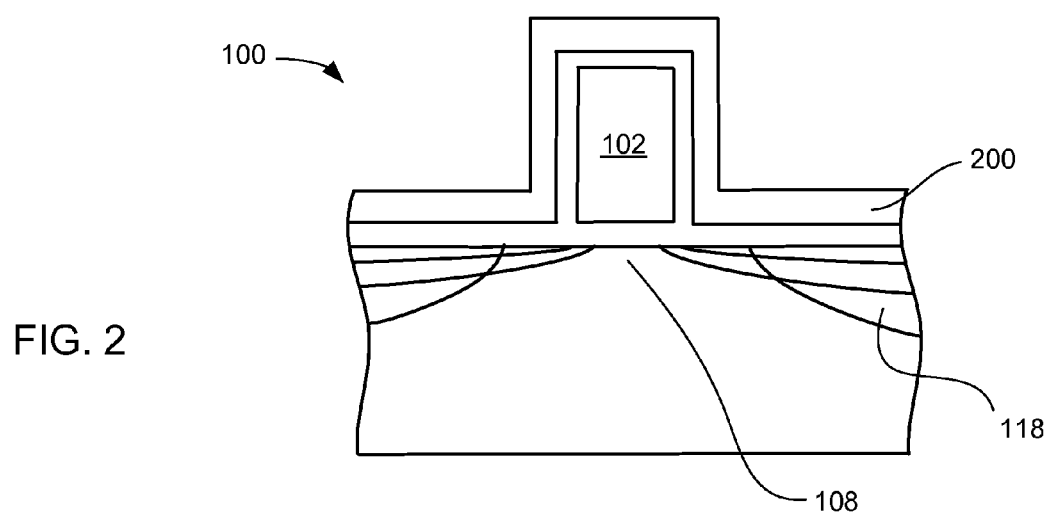
FIG. 2 is the structure of FIG. 1 after deposition of a stress memorization layer.
Figure 3:
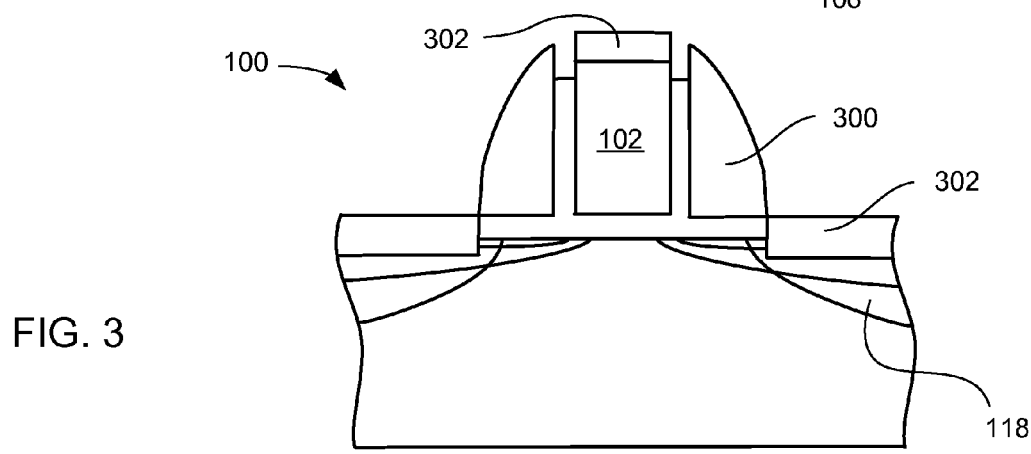
FIG. 3 is the structure of FIG. 2 after removal of the stress memorization layer and after formation of a low resistance contact.

FIGS. 1-3 depict by way of example and not by limitation, an exemplary process flow for the formation of an integrated circuit system 100, and they are not to be construed as limiting. It is to be appreciated that the present disclosure need not be limited to the integrated circuit system 100 depicted by FIGS. 1-3. Accordingly, the present invention may include any multi-electrode device in which the current flowing between two specified electrodes is controlled or modulated by the voltage applied at a control electrode. Exemplary illustrations may include an n-channel field effect transistor (NFET), a p-channel field effect transistor (PFET), a single-gate transistor, a multi-gate transistor and an annular gate transistor. Furthermore, it is to be understood that one or more of the integrated circuit system 100 could be prepared at one time on a medium, which could be separated into individual or multiple integrated circuit assemblies at a later stage of fabrication.

Referring now to FIG. 1, therein is shown a cross-sectional view of the integrated circuit system 100 in an initial stage of manufacture in accordance with an embodiment of the present invention. The integrated circuit system 100 can be formed from conventional deposition, patterning, photolithography, and etching steps.

The integrated circuit system 100 includes a gate 102 formed over a substrate 104. The substrate 104 may include a bulk semiconductor substrate or a silicon-on-insulator substrate; however, these examples are not to be construed as limiting. In accordance with the scope of the present invention, the composition of the substrate 104 may include any material that becomes amorphous upon implantation, such as ceramics, silicon, silicon based composites, plastics, or laminates of various types (organic or inorganic). The gate 102 may be formed of conventional materials, such as metals or semiconducting materials, but may also include any conducting material or composition that becomes amorphous upon implantation.

Below the gate 102 is a gate dielectric 106, and below the gate dielectric 106 is a channel 108. By way of example, the gate dielectric 106 may include silicon oxide, silicon oxynitride, silicon nitride, a silicon oxide/nitride/oxide stack or a high-k dielectric material (i.e. —one having a dielectric constant value greater than silicon oxide). However, it is to be understood that the type of material chosen for the gate dielectric is not limited to the above examples; for example, the gate dielectric 106 may include any material that permits induction of a charge in the channel 108 when an appropriate voltage is applied to the gate 102. A source/drain extension 110 can be formed adjacent the channel 108 for threshold voltage adjustment purposes and/or for counteracting short channel effects. The source/drain extension 110 may also include a halo implant 112, wherein NFET devices are typically implanted with a p-type halo implant and PFET devices are typically implanted with an n-type halo implant.

A spacer 114 is formed adjacent the gate 102. By way of example, the spacer 114 preferably includes silicon nitride, silicon oxide or a combination thereof, wherein the composition chosen depends upon the desired etch selectivity of the spacer 114. Typically, a dielectric 116, such as an oxide, forms over the substrate 104 and the gate 102 before formation of the spacer 114, and thus, the composition of the spacer 114 more preferably includes silicon nitride. After the spacer 114 is formed, a source/drain region 118 is formed by an implantation step, such as a deep source/drain implantation step. The spacer 114 defines a boundary of the source/drain region 118 during the implantation. Notably, by performing the implantation step after the spacer 114 is formed, the source/drain region 118 is strategically engineered to be offset from the channel 108, thereby helping to prevent potential adverse short channel effects.

The implantation may be done through the dielectric 116 formed over the substrate 104 and the gate 102. Various implantation techniques can be employed by the present invention, however, the chosen implantation technique must possess a sufficient energy and/or a sufficient dose to amorphize at least a portion of the substrate 104 and/or at least a portion of the gate 102. An implant with a sufficient energy and/or a sufficient dose to amorphize at least a portion of the substrate 104 and/or at least a portion of the gate 102 allows a subsequent anneal step to transfer/memorize a stress to the gate 102 and/or the source/drain region 118 during recrystallization.

The integrated circuit system 100 may further include a shallow recess 120 (shown in phantom outline) formed within the substrate 104. The shallow recess 120 can be formed during an over-etch of the spacer 114. As is evident from the disclosure herein, the shallow recess 120 further enhances the proximity effect of a subsequently deposited stress memorization material, by allowing it to be formed closer to the channel 108. By way of example, the shallow recess 120 can be formed to a depth of about 30 to about 60 nanometers.

It has been discovered by the present inventors that if a shallow recess 120 is formed, then preferably an oxide film should be deposited within the shallow recess 120 to separate the stress memorization layer 200, of FIG. 2, from the material that makes up the substrate 104. By depositing an oxide film between the shallow recess 120 of the substrate 104 and the stress memorization layer 200, delamination of the stress memorization layer 200 can be prevented.

Referring now to FIG. 2, therein is shown the structure of FIG. 1 after deposition of a stress memorization layer 200.

Notably, the spacer 114, of FIG. 1, formed adjacent the gate 102 has been removed. The spacer 114 can be removed by various suitable etching techniques, such as an isotropic etch, for example. Unlike conventional stress memorization techniques, the present invention removes the spacer 114 before placement of the stress memorization layer 200, so that the stress memorization layer 200 can be placed closer to the gate 102 and the channel 108. It has been discovered by the present inventors that the closer proximity of the stress memorization layer 200 to the gate 102 and the channel 108 improves the effectiveness of the stress transfer during a subsequent anneal step. Pursuant to its proximity to the channel 108, the stress memorization layer 200 may also be referred to as a close proximity stress memorization layer.

In accordance with the scope of the present invention, the stress memorization layer 200 may include any material that transfers its inherent stress to the gate 102, the channel 108, and/or the source/drain region 118 during the stress memorization anneal. For example, the stress memorization layer 200 may include a compressively stressed layer or a tensile stressed layer. Furthermore, it is to be understood that a multitude of deposition parameters, such as reactant flow rates, pressure, temperature, RF power, reactant materials, and thickness, can be adjusted to modulate the stress within the stress memorization layer 200. As an exemplary illustration the stress memorization layer 200 may include a silicon nitride layer deposited by a plasma enhanced chemical vapor deposition process.

After deposition of the stress memorization layer 200 over the integrated circuit system 100, an anneal step is performed to transfer the stress from within the stress memorization layer 200 into the gate 102 and/or the source/drain region 118. After annealing the stress memorization layer 200, each of the gate 102, the channel 108 and/or the source/drain region 118 can be described as exhibiting the characteristics of stress memorization (i.e. —their physical properties have been affected by the stress memorization layer 200). For example, the gate 102, the channel 108 and/or the source/drain region 118 may exhibit a tensile stressed nature or a compressive stressed nature.

The present invention achieves stress memorization transfer by annealing the integrated circuit system 100 with a temperature sufficiently high enough to cause recrystallization of amorphous regions (e.g. —due to the implantation described in FIG. 1) located within the gate 102 and/or the source/drain region 118. The stress from the stress memorization layer 200 can be retained within the gate 102 and/or the source/drain region 118 through the recrystallization anneal.

Not wishing to be limited to any particular theory, the present inventors believe that during annealing, the amorphous regions located within the gate 102 and/or the source/drain region 118 are recrystallized under a field of stress induced by the stress memorization layer 200. The field of stress induced by the stress memorization layer 200 is believed to cause the atoms of the gate 102 and/or the source/drain region 118 to align or crystallize with a compressively stressed lattice or a tensile stressed lattice.

The stress transferred by the stress memorization layer 200 into the gate 102 and/or the source/drain region 118 improves the carrier mobility of the integrated circuit system 100. The carrier mobility of the integrated circuit system 100 is improved because the recrystallized stressed regions of the gate 102 and/or the source/drain region 118 induce stress within the channel 108, thereby improving carrier mobility.

It is to be understood that the anneal of the present invention may include any thermal process that causes the amorphous regions of the gate 102 and/or the source/drain region 118 to recrystallize under the stress of, and retain the stress of, the stress memorization layer 200. Furthermore, the anneal of the present invention may also include any thermal process that causes electrical activation of the dopants introduced during the implantation step of FIG. 1. As exemplary illustrations, the anneal may include a rapid thermal anneal, a spike anneal, a flash lamp anneal, and/or a laser anneal.

Referring now to FIG. 3, therein is shown the structure of FIG. 2 after removal of the stress memorization layer 200 and after formation of a low resistance contact 302. Notably, the stress memorization layer 200, of FIG. 2, has been removed. The stress memorization layer 200 can be removed by various suitable etching techniques, such as an isotropic etch, for example. After removal of the stress memorization layer 200, a low resistance contact blocking film can be deposited, patterned and etched anisotropically, to form a low resistance contact spacer 300 adjacent the gate 102.

Notably, the low resistance contact spacer 300 needs to be larger than the spacer 114, of FIG. 1, to ensure that the low resistance contact 302 is only formed over the source/drain region 118. By forming the low resistance contact spacer 300 larger than the spacer 114, the low resistance contact spacer 300 prevents the low resistance contact 302 from consuming the source/drain extension 110 during formation of the low resistance contact 302, thereby preventing junction leakage and shorting of the source/drain extension 110.

The appropriate size of the low resistance contact spacer 300 can be achieved by depositing the low resistance contact blocking film with a sufficient thickness that when anisotropically etched it forms the low resistance contact spacer 300 in such a manner that the low resistance contact 302 does not consume the source/drain extension 110 during formation. In accordance with the invention, the low resistance contact blocking film may include any material that blocks the subsequent formation of the low resistance contact 302.

After formation of the low resistance contact spacer 300, the integrated circuit system 100 may undergo a cleaning step to remove surface contaminants, such as particles, organics and oxides that existed over the gate 102 and the source/drain region 118. After the cleaning step, a silicide or salicide process may be employed to form the low resistance contact 302 over the gate 102 and/or the source/drain region 118. It is to be understood that the low resistance contact 302 may include any conducting compound that forms an interface between itself and the substrate 104 that is thermally stable and provides uniform electrical properties with low resistance. For purposes of illustration, the low resistance contact 302 may include materials such as, refractory metals.

It is to be understood that a plurality of modifications, additions, and/or omissions may be made to the process of FIGS. 1-3 without departing from the scope of the present invention. For example, the process may include more, fewer, or other steps.

Figure 4:
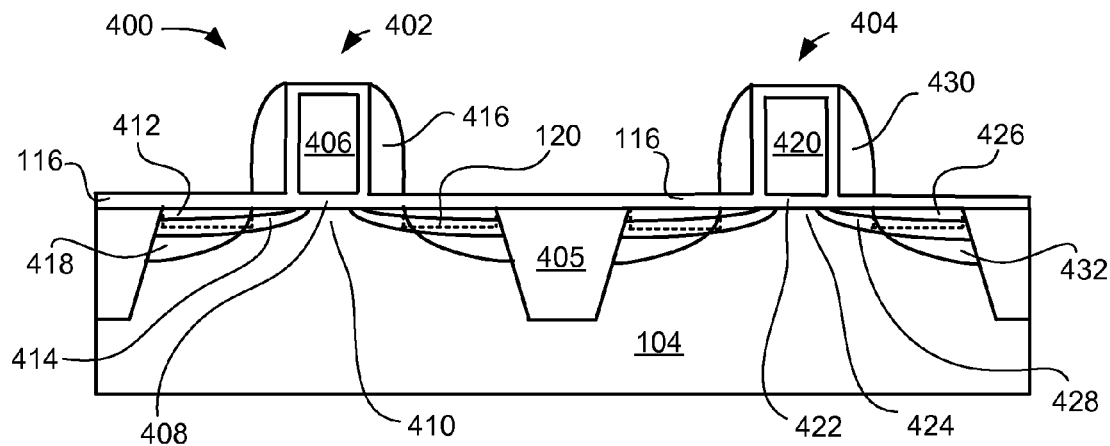
FIG. 4 is a cross-sectional view of the integrated circuit system in an initial stage of manufacture in accordance with another embodiment of the present invention.
Figure 5:
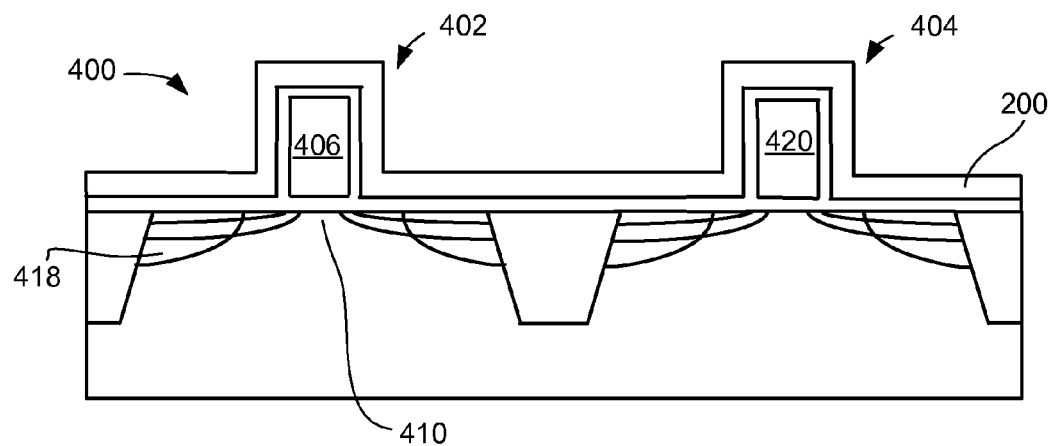
FIG. 5 is the structure of FIG. 4 after deposition of the stress memorization layer.
Figure 6:
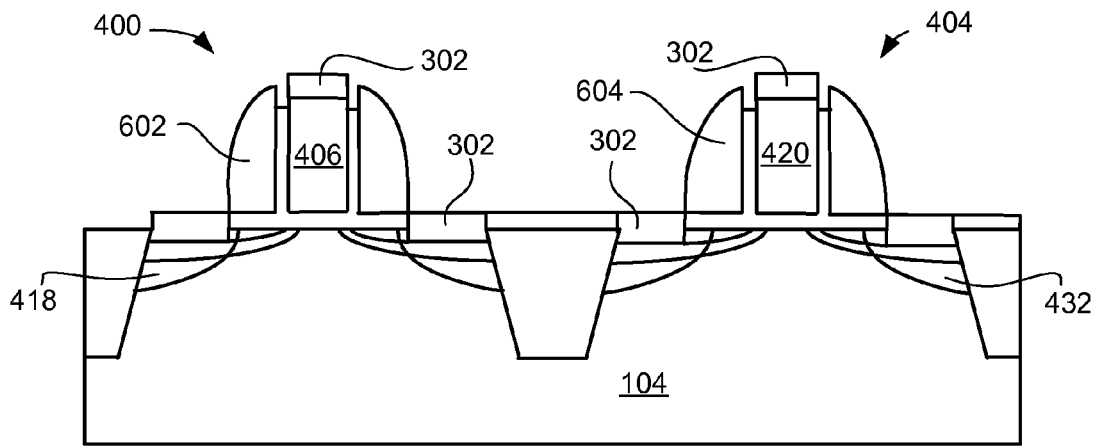
FIG. 6 is the structure of FIG. 5 after selective removal of the stress memorization layer and after formation of the low resistance contact.

Referring now to FIGS. 4-6. FIGS. 4-6 generally depict the close proximity stress memorization technique applied to adjacent multi-electrode devices.

FIGS. 4-6 depict by way of example and not by limitation, an exemplary process flow for the formation of an integrated circuit system 400, and they are not to be construed as limiting. It is to be appreciated that the present disclosure need not be limited to the integrated circuit system 400 depicted by FIGS. 4-6. Accordingly, the present invention includes any multi-electrode device formed adjacent another multi-electrode device, in which the current flowing between two specified electrodes of each device is controlled or modulated by the voltage applied at a control electrode of each device. Exemplary illustrations may include a complementary metaloxide-semiconductor (CMOS) configuration or a CMOS configuration with different gate heights. Furthermore, it is to be understood that one or more of the integrated circuit system 400 could be prepared at one time on a medium, which could be separated into individual or multiple integrated circuit assemblies at a later stage of fabrication.

Referring now to FIG. 4, therein is shown a cross-sectional view of the integrated circuit system 400 in an initial stage of manufacture in accordance with another embodiment of the present invention. The integrated circuit system 400 can be formed from conventional deposition, patterning, photolithography, and etching to form an NFET device 402 and a PFET device 404 separated by an isolation structure 405. The NFET device 402 and the PFET device 404 may operate together, thereby forming a CMOS configuration.

The integrated circuit system 400 includes an NFET gate 406 formed over the substrate 104. The substrate 104 may include a bulk semiconductor substrate or a silicon-on-insulator substrate; however, these examples are not to be construed as limiting. In accordance with the scope of the present invention, the composition of the substrate 104 may include any material that becomes amorphous upon implantation, such as ceramics, silicon, silicon based composites, plastics, or laminates of various types (organic or inorganic). The NFET gate 406 may be formed of conventional materials, such as metals or semiconducting materials, but may also include any conducting material or composition that becomes amorphous upon implantation.

Below the NFET gate 406 is an NFET gate dielectric 408, and below the NFET gate dielectric 408 is an NFET channel 410. By way of example, the NFET gate dielectric 408 may include silicon oxide, silicon oxynitride, silicon nitride, a silicon oxide/nitride/oxide stack or a high-k dielectric material (i.e. —one having a dielectric constant value greater than silicon oxide). However, it is to be understood that the type of material chosen for the NFET gate dielectric 408 is not limited to the above examples; for example, the NFET gate dielectric 408 may include any material that permits induction of a charge in the NFET channel 410 when an appropriate voltage is applied to the NFET gate 406. An NFET source/drain extension 412 can be formed adjacent the NFET channel 410 for threshold voltage adjustment purposes and/or for counteracting short channel effects. The NFET source/drain extension 412 may also include an NFET halo implant 414, wherein the NFET device 402 is implanted with a p-type halo implant.

An NFET spacer 416 is formed adjacent the NFET gate 406. By way of example, the NFET spacer 416 preferably includes silicon nitride, silicon oxide or a combination thereof, wherein the composition chosen depends upon the desired etch selectivity of the NFET spacer 416. Typically, the dielectric 116, such as an oxide, forms over the substrate 104 and over the NFET gate 406 before formation of the NFET spacer 416, and thus, the composition of the NFET spacer 416 more preferably includes silicon nitride. After the NFET spacer 416 is formed, an NFET source/drain region 418 is formed by an implantation step, such as an NFET deep source/drain implantation step. The NFET spacer 416 defines a boundary of the NFET source/drain region 418 during the implantation. Notably, by performing the implantation step after the NFET spacer 416 is formed, the NFET source/drain region 418 is strategically engineered to be offset from the NFET channel 410, thereby helping to prevent potential adverse short channel effects.

The implantation may be done through the dielectric 116 formed over the substrate 104 and the NFET gate 406. Various implantation techniques can be employed by the present invention, however, the chosen implantation technique must possess a sufficient energy and/or a sufficient dose to amorphize at least a portion of the NFET gate 406 and/or at least a portion of the NFET source/drain region 418. An implant with a sufficient energy and/or a sufficient dose to amorphize at least a portion of the NFET gate 406 and/or at least a portion of the NFET source/drain region 418 allows a subsequent anneal step to transfer/memorize a stress to the NFET gate 406 and/or the NFET source/drain region 418 during recrystallization.

The integrated circuit system 400 may further include the shallow recess 120 (shown in phantom outline) formed within the substrate 104. The shallow recess 120 can be formed during an over-etch of the NFET spacer 416. As is evident from the disclosure herein, the shallow recess 120 further enhances the proximity effect of a subsequently deposited stress memorization material, by allowing it to be formed closer to the NFET channel 410. By way of example, the shallow recess 120 can be formed to a depth of about 30 to about 60 nanometers.

It has been discovered by the present inventors that if a shallow recess 120 is formed, then preferably an oxide film should be deposited within the shallow recess 120 to separate the stress memorization layer 200, of FIG. 5, from the material that makes up the substrate 104. By depositing an oxide film between the shallow recess 120 of the substrate 104 and the stress memorization layer 200, delamination of the stress memorization layer 200 can be prevented.

Additionally, the integrated circuit system 400 includes a PFET gate 420 formed over the substrate 104. The PFET gate 420 may be formed of conventional materials, such as metals or semiconducting materials, but may also include any conducting material or composition that becomes amorphous upon implantation.

Below the PFET gate 420 is a PFET gate dielectric 422, and below the PFET gate dielectric 422 is a PFET channel 424. By way of example, the PFET gate dielectric 422 may include silicon oxide, silicon oxynitride, silicon nitride, a silicon oxide/nitride/oxide stack or a high-k dielectric material (i.e. —one having a dielectric constant value greater than silicon oxide). However, it is to be understood that the type of material chosen for the PFET gate dielectric 422 is not limited to the above examples; for example, the PFET gate dielectric 422 may include any material that permits induction of a charge in the PFET channel 424 when an appropriate voltage is applied to the PFET gate 420. A PFET source/drain extension 426 can be formed adjacent the PFET channel 424 for threshold voltage adjustment purposes and/or for counteracting short channel effects. The PFET source/drain extension 426 may optionally include a PFET halo implant 428, wherein the PFET device 404 is implanted with an n-type halo implant.

A PFET spacer 430 is formed adjacent the PFET gate 420. By way of example, the PFET spacer 430 preferably includes silicon nitride, silicon oxide or a combination thereof, wherein the composition chosen depends upon the desired etch selectivity of the PFET spacer 430. Typically, the dielectric 116, such as an oxide, forms over the substrate 104 and over the PFET gate 420 before formation of the PFET spacer 430, and thus, the composition of the PFET spacer 430 more preferably includes silicon nitride. After the PFET spacer 430 is formed, a PFET source/drain region 432 is formed by an implantation step, such as a PFET deep source/drain implantation step.

The implantation may be done through the dielectric 116 formed over the substrate 104 and the PFET gate 420. Various conventional implantation techniques well known within the art can be employed by the present invention. For example, the chosen implantation technique can possess a sufficient energy and/or a sufficient dose to amorphize at least a portion of the PFET gate 420 and/or at least a portion of the PFET source/drain region 432.

Referring now to FIG. 5, therein is shown the structure of FIG. 4 after deposition of the stress memorization layer 200. Notably, the NFET spacer 416, of FIG. 4, formed adjacent the NFET gate 406 has been removed. Additionally, the PFET spacer 430, of FIG. 4, formed adjacent the PFET gate 420 may optionally be removed, as well. The NFET spacer 416 and the PFET spacer 430 can be removed by various suitable etching techniques, such as an isotropic etch, for example. Unlike conventional stress memorization techniques, the present invention, at a minimum, removes the NFET spacer 416 before placement of the stress memorization layer 200, so that the stress memorization layer 200 can be placed closer to the NFET gate 406 and the NFET channel 410. It has been discovered by the present inventors that the closer proximity of the stress memorization layer 200 to the NFET gate 406 and the NFET channel 410 improves the effectiveness of the stress transfer to the NFET device 402 during a subsequent anneal step. Pursuant to its proximity to the NFET channel 410, the stress memorization layer 200 may be referred to as a close proximity stress memorization layer.

Although the present embodiment depicts the stress memorization layer 200 formed over the PFET device 404, it is to be understood that the stress memorization layer 200 need not be formed over the PFET device 404. For example, a masking layer can be formed over the PFET device 404, thereby blocking the formation of the stress memorization layer 200 over the PFET device 404, or the portion of the stress memorization layer 200 formed over the PFET device 404 can be removed by etching.

In accordance with the scope of the present invention, the stress memorization layer 200 may include any material that transfers its inherent stress to the NFET gate 406 and/or the NFET source/drain region 418 during the stress memorization anneal. For example, the stress memorization layer 200 may include a tensile stressed layer. Furthermore, it is to be understood that a multitude of deposition parameters, such as reactant flow rates, pressure, temperature, RF power, reactant materials, and thickness, can be adjusted to modulate the stress within the stress memorization layer 200. As an exemplary illustration the stress memorization layer 200 may include a silicon nitride layer deposited by a plasma enhanced chemical vapor deposition process.

After deposition of the stress memorization layer 200, an anneal step is performed to transfer the stress from within the stress memorization layer 200 into the NFET gate 406 and/or the NFET source/drain region 418. After annealing the stress memorization layer 200, each of the NFET gate 406, the NFET channel 410 and/or the NFET source/drain region 418 can be described as exhibiting the characteristics of stress memorization (i.e. —their physical properties have been affected by the stress memorization layer 200). For example, the NFET gate 406, the NFET channel 410 and/or the NFET source/drain region 418 may exhibit a tensile stressed nature.

The present invention achieves stress memorization transfer by annealing the integrated circuit system 400 with a temperature sufficiently high enough to cause recrystallization of amorphous regions (e.g. —due to the implantation described in FIG. 4) located within the NFET gate 406 and/or the NFET source/drain region 418. The stress from the stress memorization layer 200 can be retained within the NFET gate 406 and/or the NFET source/drain region 418 through the recrystallization anneal.

Not wishing to be limited to any particular theory, the present inventors believe that during annealing, the amorphous regions located within the NFET gate 406 and/or the NFET source/drain region 418 are recrystallized under a field of stress induced by the stress memorization layer 200. The field of stress induced by the stress memorization layer 200 is believed to cause the atoms of the NFET gate 406 and/or the NFET source/drain region 418 to align or crystallize with a tensile stressed lattice.

The stress transferred by the stress memorization layer 200 into the NFET gate 406 and/or the NFET source/drain region 418 improves the carrier mobility of the integrated circuit system 400. The carrier mobility of the integrated circuit system 400 is improved because the recrystallized stressed regions of the NFET gate 406 and/or the NFET source/drain region 418 induce stress within the NFET channel 410, thereby improving carrier mobility.

It is to be understood that the anneal of the present invention may include any thermal process that causes the amorphous regions of the NFET gate 406 and/or the NFET source/drain region 418 to recrystallize under the stress of, and retain the stress of, the stress memorization layer 200. Furthermore, the anneal of the present invention may also include any thermal process that causes electrical activation of the dopants introduced during the implantation step of FIG. 4. As exemplary illustrations, the anneal may include a rapid thermal anneal, a spike anneal, a flash lamp anneal, and/or a laser anneal.

Referring now to FIG. 6, therein is shown the structure of FIG. 5 after selective removal of the stress memorization layer 200 and after formation of the low resistance contact 302. Notably, the stress memorization layer 200, of FIG. 5, has been removed. The stress memorization layer 200 can be removed by various suitable etching techniques, such as an isotropic etch, for example. After removal of the stress memorization layer 200, a low resistance contact blocking film can be deposited, patterned and etched anisotropically, to form an NFET low resistance contact spacer 602 adjacent the NFET gate 406. Additionally, it is to be understood that the low resistance contact blocking film can be etched to form a PFET low resistance contact spacer 604 adjacent the PFET gate 420, if the low resistance contact 302 is desired over the PFET source/drain region 432. Although not shown, the low resistance contact blocking film can remain intact over structures that are not meant to posses the low resistance contact 302.

Notably, the NFET low resistance contact spacer 602 needs to be larger than the NFET spacer 416, of FIG. 4, to ensure that the low resistance contact 302 is only formed over the NFET source/drain region 418. By forming the NFET low resistance contact spacer 602 larger than the NFET spacer 416, the NFET low resistance contact spacer 602 prevents the low resistance contact 302 from consuming the NFET source/drain extension 412 during formation of the low resistance contact 302, thereby preventing junction leakage and shorting of the NFET source/drain extension 412. The PFET low resistance contact spacer 604 also needs to be larger than the PFET spacer 430, of FIG. 4, to ensure that the low resistance contact 302 is only formed over the PFET source/drain region 432.

The appropriate size of the NFET low resistance contact spacer 602 can be achieved by depositing the low resistance contact blocking film with a sufficient thickness that when anisotropically etched it forms the NFET low resistance contact spacer 602 in such a manner that the low resistance contact 302 does not consume the NFET source/drain extension 412 during formation. Additionally, the appropriate size of the PFET low resistance contact spacer 604 can be achieved by depositing the low resistance contact blocking film with a sufficient thickness that when anisotropically etched it forms the PFET low resistance contact spacer 604 in such a manner that the low resistance contact 302 does not consume the PFET source/drain extension 426 during formation.

In accordance with the invention, the low resistance contact blocking film may include any material that blocks the subsequent formation of the low resistance contact 302.

After formation of the NFET low resistance contact spacer 602 and the PFET low resistance contact spacer 604, the integrated circuit system 400 may undergo a cleaning step to remove surface contaminants, such as particles, organics and oxides that existed over the NFET gate 406, the NFET source/drain region 418, the PFET gate 420 and the PFET source/drain region 432. After the cleaning step, a silicide or salicide process may be employed to form the low resistance contact 302 over the NFET gate 406, the NFET source/drain region 418, the PFET gate 420 and/or the PFET source/drain region 432. It is to be understood that the low resistance contact 302 may include any conducting compound that forms an interface between itself and the substrate 104 that is thermally stable and provides uniform electrical properties with low resistance. For purposes of illustration, the low resistance contact 302 may include materials such as, refractory metals.

It is to be understood that a plurality of modifications, additions, and/or omissions may be made to the process of FIGS. 4-6 without departing from the scope of the present invention. For example, the process may include more, fewer, or other steps. Additionally, steps may be performed in any suitable order without departing from the scope of the present invention.

Figure 7:
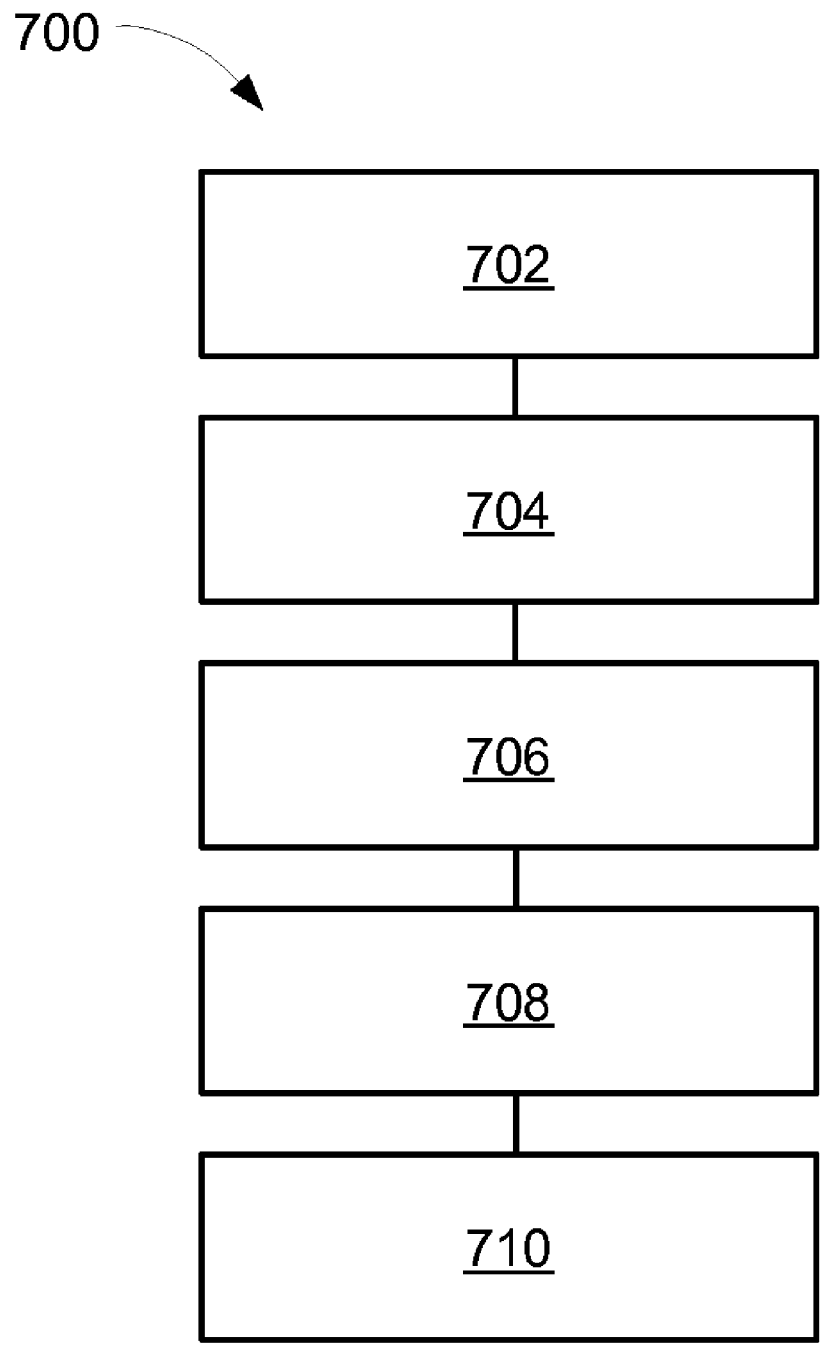
FIG. 7 is a flow chart of an integrated circuit system for an integrated circuit system in accordance with an embodiment of the present invention.

Referring now to FIG. 7, therein is shown a flow chart of an integrated circuit system 700 for the integrated circuit system 100 in accordance with an embodiment of the present invention. The integrated circuit system 700 includes providing a gate and a spacer formed over a substrate in a block 702; performing an implant that amorphizes the gate and a source/drain region defined by the spacer in a block 704; removing the spacer in a block 706; depositing a stress memorization layer over the integrated circuit system in a block 708; and transferring a stress from the stress memorization layer to the gate and the source/drain region in a block 710.

It has been discovered that the present invention thus has numerous aspects. One such aspect is that the present invention removes a gate sidewall spacer before depositing a stress memorization film, thereby improving the efficiency of a stress memorization transfer anneal to the channel of a transistor.

Another aspect is improved carrier mobility within the channel of a transistor due to the close proximity of a stress memorization layer during a stress transfer anneal.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit system of the present invention furnishes important and heretofore unknown and unavailable solutions, capabilities, and functional aspects for enhancing carrier mobility within the channel of a transistor. The resulting processes and configurations are straightforward, cost-effective, uncomplicated, highly versatile and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. An integrated circuit system comprising:
   a substrate;
   a gate dielectric directly on the substrate;
   a gate directly on the gate dielectric;
   a source/drain region in the substrate defining a channel, the source/drain region having a boundary characteristic of a spacer;
   a stress region characteristic of a stress transferred from a stress memorization layer to the gate and the source/drain region; and
   a contact spacer adjacent the gate, the contact spacer completely on the stress region characteristic of the stress memorization layer removed.

2. The system as claimed in claim 1 wherein:
   the substrate includes a bulk semiconductor substrate or a silicon-on-insulator substrate.

3. The system as claimed in claim 1 wherein:
   the channel includes a compressively stressed channel.

4. The system as claimed in claim 1 wherein:
   the channel includes a tensile stressed channel.

5. The system as claimed in claim 1 further comprising:
   a low resistance contact formed over the gate and the source/drain region.

6. The system as claimed in claim 1 wherein:
   the channel includes an NFET channel formed within a CMOS device.

7. The system as claimed in claim 1 wherein:
   the stress region within the gate and the source/drain region induces stress within the channel.

8. The system as claimed in claim 1 wherein:
   the substrate includes a shallow recess.

9. The system as claimed in claim 1 wherein:
   the channel exhibits the characteristics of stress memorization due to a close proximity stress memorization layer.

10. The system as claimed in claim 1 further comprising:
    a source/drain extension and a halo implant in the substrate.

* * * * *